United States Patent
Yazawa et al.

(10) Patent No.: US 7,891,864 B2
(45) Date of Patent: Feb. 22, 2011

(54) METHOD, DEVICE AND SYSTEM FOR CONTROLLING HEATING CIRCUITS

(75) Inventors: Kazuaki Yazawa, Chiba (JP); Tetsuji Tamura, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 602 days.

(21) Appl. No.: 10/589,912

(22) PCT Filed: Mar. 17, 2005

(86) PCT No.: PCT/JP2005/004840

§ 371 (c)(1),
(2), (4) Date: Nov. 13, 2006

(87) PCT Pub. No.: WO2005/091362

PCT Pub. Date: Sep. 29, 2005

(65) Prior Publication Data
US 2008/0017367 A1    Jan. 24, 2008

(30) Foreign Application Priority Data

Mar. 19, 2004  (JP) ............................ 2004-081739
Jun. 17, 2004  (JP) ............................ 2004-180281

(51) Int. Cl.
*G01K 17/06* (2006.01)
(52) U.S. Cl. ............................ 374/29; 374/178; 374/5; 219/201; 361/688
(58) Field of Classification Search .... 702/130–136.99; 374/170–173, 175, 178, 4, 5, 120, 121, 137, 374/29, 43–44, 100, 134, 1; 361/704, 710, 361/711, 709, 688, 679.1; 257/467; 324/760, 324/763, 765; 219/200, 201, 209, 494

See application file for complete search history.

(56) References Cited

U.S. PATENT DOCUMENTS

| | | | | | |
|---|---|---|---|---|---|
| 3,868,508 A | * | 2/1975 | Lloyd | .......................... | 250/330 |
| 5,208,528 A | * | 5/1993 | Quintard | .................. | 324/158.1 |
| 5,653,539 A | * | 8/1997 | Rosengaus | .................. | 374/159 |
| 5,864,176 A | * | 1/1999 | Babock et al. | .............. | 257/714 |
| 6,162,659 A | * | 12/2000 | Wu | ............................ | 438/106 |

(Continued)

FOREIGN PATENT DOCUMENTS

JP    05-067712    3/1993

(Continued)

OTHER PUBLICATIONS

International Preliminary Report on Patentability based on PCT/JP2005/004840, dated Sep. 28, 2006; 9 pgs.

(Continued)

*Primary Examiner*—Gail Verbitsky
(74) *Attorney, Agent, or Firm*—Matthew B. Dernier, Esq.; Gibson & Dernier LLP

(57) ABSTRACT

A heat control apparatus for a circuit includes: a heat detecting unit which acquires the heat generation condition of a semiconductor integrated circuit from an inspection image obtained by capturing an image of the semiconductor integrated circuit by an image capturing sensor; and a cooling control unit which controls a cooling means for cooling the semiconductor integrated circuit in accordance with the acquired heat generation condition.

8 Claims, 6 Drawing Sheets

U.S. PATENT DOCUMENTS

| | | | |
|---|---|---|---|
| 6,375,347 B1 * | 4/2002 | Bruce et al. | 374/5 |
| 6,836,131 B2 * | 12/2004 | Cader et al. | 324/760 |
| 7,167,806 B2 * | 1/2007 | Hamann et al. | 702/136 |
| 7,296,928 B2 * | 11/2007 | Bowden et al. | 374/163 |
| 2002/0180467 A1 | 12/2002 | Araki | |
| 2004/0032275 A1 * | 2/2004 | Cader et al. | 324/760 |
| 2005/0082480 A1 * | 4/2005 | Wagner et al. | 250/338.1 |
| 2005/0094704 A1 * | 5/2005 | De Cicco et al. | 374/120 |
| 2008/0101435 A1 * | 5/2008 | Chandler et al. | 374/120 |
| 2009/0116805 A1 * | 5/2009 | Rice et al. | 385/131 |
| 2009/0146359 A1 * | 6/2009 | Canfield et al. | 269/289 R |

FOREIGN PATENT DOCUMENTS

| | | |
|---|---|---|
| JP | 06-342990 | 12/1994 |
| JP | 09-162337 | 6/1997 |
| JP | 10-093010 | 4/1998 |
| JP | 10-308485 | 11/1998 |
| JP | 2003-198026 | 7/2003 |
| JP | 2003-309237 | 10/2003 |

OTHER PUBLICATIONS

Office Action for corresponding Chinese Patent Application No. 200580008910.3 dated Feb. 15, 2008.

International Search Report, dated Jun. 28, 2005, based on PCT/JP2005/004840, 2 pgs.

Office Action in corresponding priority application JP 2004-180281, dated Jun. 7, 2005, 2 pgs.

Office Action in corresponding priority application JP 2004-180281, dated Nov. 1, 2005, 2 pgs.

* cited by examiner

100

18

METHOD, DEVICE AND SYSTEM FOR CONTROLLING HEATING CIRCUITS

BACKGROUND OF THE INVENTION

1. Field of the Invention

The present invention relates to a heat generation control technology and, more particularly, to a method, apparatus and system for controlling heat generation from a semiconductor integrated circuit.

2. Description of the Related Art

As the process of fabrication becomes increasingly finer and components are more highly integrated, heat value has become an important concern in designing an LSI as a parameter indicating a limit of chip performance. As a chip is heated to a high temperature, the chip may operate improperly or the long-term reliability thereof decreases. Therefore, various countermeasures for heat generation are taken. For example, a heat sink may be provided on top of a chip to allow heat from the chip to escape.

In LSIs fabricated recently and, particularly, in a high-performance microprocessor, heat may be generated that cannot be dissipated by a heat sink. Therefore, improvement in heat release efficiency and prevention of heat generation itself remain goals to be achieved. In developing an LSI product, it is necessary to guarantee heat release effect or heat prevention effect on a set by set basis. A prerequisite for this is to accurately evaluate these effects in the process of developing the product.

SUMMARY OF THE INVENTION

The present invention has been made in view of the aforementioned goals and an object thereof is to provide an efficient heat control technology for a semiconductor integrated circuit. Another object of the present invention is to provide a technology for properly evaluating heat control effects.

The present invention is directed to a heat control technology whereby the heat generation condition of a semiconductor integrated circuit is acquired with a high two-dimensional resolution so that the heat generation condition of the semiconductor integrated circuit is changed in accordance with the acquired heat generation condition.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Summary of the Embodiments

Figure 1:
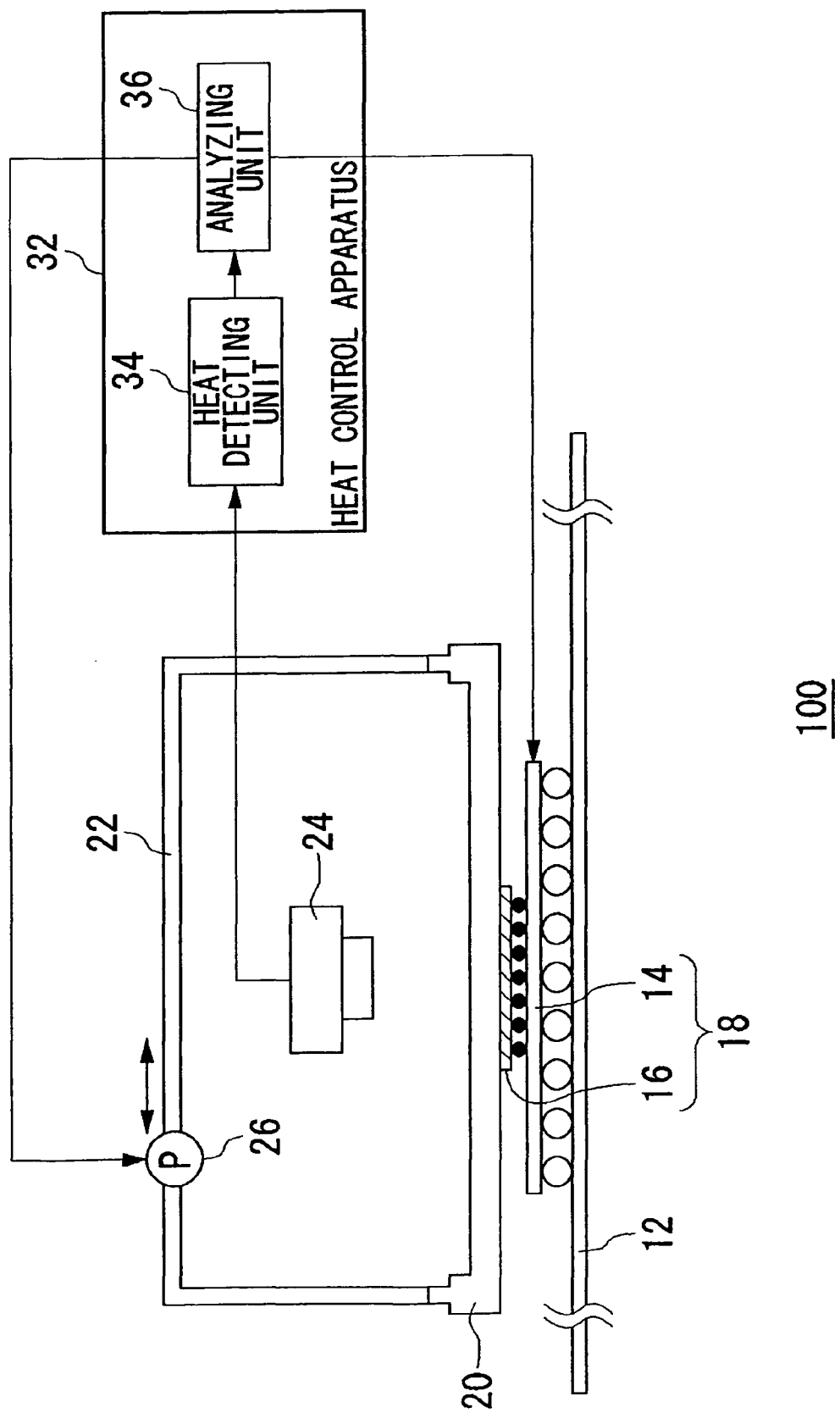
FIG. 1 shows the overall structure of a heat control system according to a first embodiment.

Conceivable methods for measuring temperature on a die of a microprocessor (hereinafter, simply referred to as a processor) include a method of measuring a forward voltage in a PN junction of a thermal diode or a method of utilizing temperature characteristics of the frequency of a ring oscillator. Both of these methods are hard to implement in an actual device due to constraints such as mounting area and the like. For accurate measurement of temperature distribution, a large number of temperature sensors should be embedded, causing serious demerits in design.

The embodiments of the present invention address these aspects by acquiring the heat generation condition of a semiconductor integrated circuit with a high two-dimensional resolution, and changing the heat generation condition of the semiconductor integrated circuit in accordance with the acquired heat generation condition. "Changing the heat generation condition" encompasses changing a heat release condition first so as to change the heat generation condition consequently. By using an image capturing sensor such as an infrared sensor, characterized by a high two-dimensional resolution, temperature measurement at plural points is achieved, the number of points being commensurate with the resolution. With this, the aforementioned problems are solved.

An infrared sensor is taken as an example of an image capturing sensor in the following description. In the actual embodiments, an infrared camera in which an infrared sensor and an optical mechanism such as a lens are combined is used. The camera is used in the field of infrared thermography technology and is designed to measure and image the surface temperature or temperature distribution of an object. Since temperature is detected by capturing an image according to the embodiments, noncontact temperature measurement at a distance from a targeted semiconductor circuit device is possible. Thereby, the flexibility in designing a semiconductor circuit device and a set is improved. Since this method is adapted to capture temperature distribution on a surface, relative measurement comparing points on the surface is possible. Thereby, a high-temperature location can be identified using a simple structure. More specifically, the embodiments relate to the following technology.

An image capturing sensor is provided. The sensor captures an image of a semiconductor integrated circuit. A flip-chip package semiconductor integrated circuit is favorable for the purpose of image capturing in that the backside of a die is disclosed. A semiconductor integrated circuit sealed in an ordinary package such as a plastic package presents no problem, through. A heat detecting unit acquires the heat generation condition of the semiconductor integrated circuit from an image (referred to as an inspection image) obtained by image capturing. A cooling control unit controls a means for cooling the semiconductor integrated circuit in accordance with the acquired heat generation condition (primarily relevant to fourth embodiment). For example, the rpm of a fan or the flow rate of a coolant is controlled.

The heat detecting unit acquires, from the inspection image, the temperature distribution of the semiconductor integrated circuit and, particularly, the exposed surface thereof. When the temperature exceeds a predetermined threshold value at any location in the semiconductor integrated circuit, the cooling control unit enhances the cooling capability of the cooling means (primarily relevant to the first, second, third and fourth embodiments).

In place of, or in addition to, the cooling control unit, an operation control unit for controlling the operating condition of the semiconductor integrated circuit in accordance with the acquired heat generation condition is provided. When the temperature a predetermined threshold value at any location in the semiconductor integrated circuit, the operating condition control unit reduces the processing load per unit time in the location in which the temperature exceeds the threshold value (referred to as a high-temperature location). For this purpose, the operating frequency of the semiconductor integrated circuit may be lowered (primarily relevant to the fourth embodiment).

A transparent cooling mechanism tightly secured to the semiconductor integrated circuit and, particularly, the exposed surface thereof, is provided. The term "transparent" means transparency sufficient to allow temperature measurement. In performing temperature measurement using an infrared sensor, transparency in the infrared zone is important since infrared radiation from a heat generating object is detected. In other words, visual transparency is not required. In addition, complete transparency in the infrared zone is not required. What is required is that the cooling mechanism is of a transmittance by which the temperature of the semiconductor integrated circuit generating heat is detected by correction. The cooling mechanism is provided with a hollow part and a passage through which fluid such as liquid or gas passes. An example of the cooling mechanism with a hollow part is a flat pipe or a solid object of glass or the like in which a coolant passage is provided by boring. A drive mechanism such as a pump causes a coolant such as liquid or gas to flow through the interior of the cooling mechanism. An image capturing sensor captures an image of the semiconductor integrated circuit through the cooling mechanism. The heat detecting unit acquires the heat generation condition of the semiconductor integrated circuit from an inspection image captured by the sensor (primarily relevant to the first, second, third and fourth embodiments) Thereafter, an analyzing unit analyzes the acquired heat generation condition. The term "transparent" means transparency sufficient to allow the sensor to exhibit the detecting function properly. Visual transparency is not required. Actually, detection by the sensor is affected by factors including the color of the cooling mechanism, the emissivity of the cooling mechanism and the angle of measurement. The factors may ultimately be determined by experiments (primarily relevant to first, second and third embodiments).

In "4" above, the drive mechanism may change the direction of flow of the coolant. This is useful in evaluation of heat. The analyzing unit may synthetically analyze the heat generation condition detected prior to and subsequent to a change in the direction of flow of the coolant. For example, an average of heat generation conditions detected prior to and subsequent to the reversal of direction may be taken. The average may be regarded as an actual heat generation condition or temperature distribution. Since "heat generation condition" is known from "temperature distribution", no description is made between the two unless specifically required (primarily relevant to the first embodiment).

In "4" above, the analyzing unit may analyze the heat generation condition by taking into account temperature gradient dependent on the direction of flow of the coolant. The temperature of the coolant past the drive mechanism is lower toward the upstream. Conversely, the temperature is higher toward the downstream as the coolant deprive the semiconductor integrated circuit and, particularly, the exposed surface thereof, of heat. Gradient correction may be applied whereby the temperature in the upstream is depreciated and the temperature in the downstream is appreciated so that the resultant temperature distribution is regarded as an actual temperature distribution (primarily relevant to the first embodiment).

In 4 above, the transparent cooling mechanism may not be provided with a hollow part. More specifically, the cooling mechanism may be a transparent, flat heat spreader or the like. In this case, the cooling mechanism may be formed by a cooling fan, a Peltier cooler or a jet cooling mechanism instead of a drive mechanism such as a pump (primarily relevant to the second embodiment).

In the apparatuses described above, a sensor is used. A technology for enhancing heat release from a semiconductor integrated device is useful in any way, apart from the provision for a sensor. The cooling mechanism and the drive mechanism mentioned above may be provided for this purpose. The cooling mechanism may be provided with an opening adapted to the semiconductor integrated circuit and, particularly, the exposed surface thereof, and may be tightly secured to an associated location in the semiconductor integrated circuit at least at the edge of the opening. In this case, the coolant comes into direct contact with the semiconductor integrated circuit at the opening so that the effect of depriving the circuit of heat is high (primarily relevant to the fifth embodiment).

First Embodiment

The first embodiment relates to an apparatus for evaluating heat generation from a semiconductor integrated circuit in a set (end product) during the development stage. In the following paragraphs, the semiconductor integrated circuit is assumed to be a processor with a large heat value. The processor built into a set is fitted with a heat spreader for dissipating heat and a heat sink on top of the heat spreader. In such a state, the surface temperature of the processor cannot be measured. In the inventive apparatus, the heat sink and the like are removed and a transparent heat releasing means is provided instead. An infrared camera captures an image of the processor through the heat releasing means so as to acquire temperature distribution. The heat releasing means simulates the function of the heat sink and the like. The heat releasing means is provided to predict heat generation in a state in which the processor is in actual use, i.e., in a state in which a heat sink and the like are fitted to the processor. For accurate simulation of the heat sink and the like, the configuration and material of the cooling mechanism, and the type and flow rate of the coolant may be configured by using a thermal conduction simulator or the like. Meanwhile, simulation is limited in its capability and should be used in combination with experiments. In this regard, the apparatus of the embodiment and simulation supplement each other.

The result of heat evaluation is reflected in the specification of the processor. For example, the inventive apparatus can estimate the duration of maximum processor load required for the temperature of a high-temperature location to exceed a guaranteed operation range.

Figure 2:
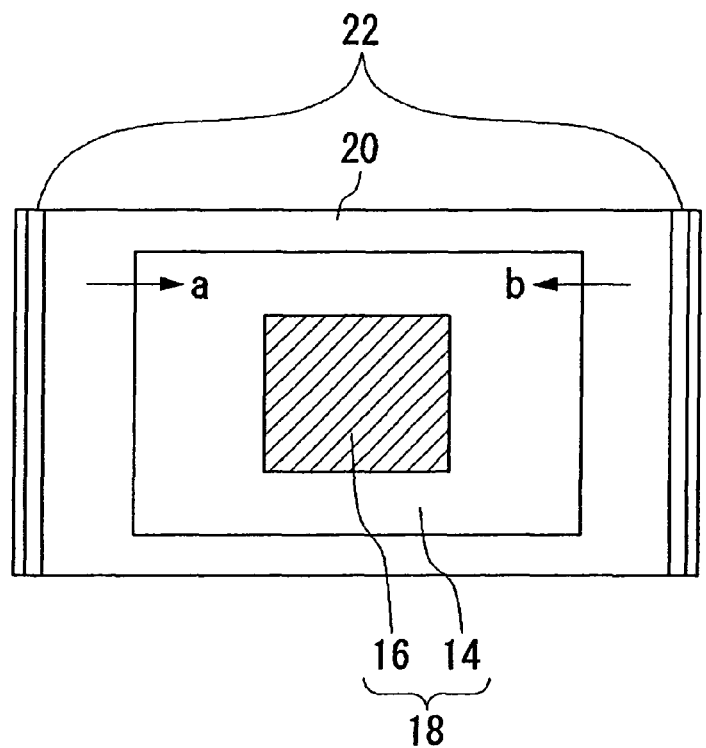
FIG. 2 is a partial top view of FIG. 1.

FIG. 1 shows the overall structure of a heat control system 100 according to this embodiment. FIG. 2 is a top view of a hollow glass plate 20 of FIG. 1 and its neighborhood. A processor 18 is mounted on a printed board 12. The processor 18 is of a flip-chip type and is provided with a die 16 and a package base 14 provided with external terminals of a ball grid array (BGA) type.

The backside of the die 16 is exposed. A flat hollow glass plate 20 is adhesively attached to the exposed surface by anodic bonding or the like. This type of bonding does not require an interface material such as thermal grease, thereby producing a high coefficient of thermal conductivity.

The hollow glass plate 20 is connected to a fine passage 22. A pump 26 is provided in the middle of the fine passage 22. The pump 26 drives the coolant to circulate in the fine passage 22 and the hollow glass plate 20 so as to cool the backside of the die 16. The coolant may be a liquid or a gas but must be transparent so as not to affect temperature detection by the infrared camera 24. Arrows a and b of FIG. 2 indicate directions of flow of the coolant. The pump 26 may reverse the direction of driving the coolant. The flat surface of the hollow glass plate 20 is larger than the size of the processor 18 so that the coolant flows uniformly on the die 16. By providing the cooling mechanism as described above, the hollow part of the hollow glass plate 20 covers the primary portion of the processor 18. That is, the coolant covers the primary portion of the processor 18. In this way, the heat release condition of a heat sink is simulated. The term "primary portion" refers to half the area of the processor 18 or more, the great majority of the area thereof, the entirety thereof, the portion characterized by a large heat value or the central portion of the processor 18.

The infrared camera 24 of FIG. 1 captures an image of the die 16 through the hollow glass plate 20. For example, the spatial resolution of the infrared camera 24 is 100×100. This is equivalent to two-dimensional, tight arrangement of sensors providing the same resolution. The time resolution of the infrared camera 24 is sufficient to capture 10-100 pictures per second.

A heat control apparatus 32 is provided with a heat detecting unit 34 and an analyzing unit 36. The heat detecting unit 34 receives an inspection image from the infrared camera 24 so as to capture the temperature distribution of the die 16 and store the distribution as image data in a memory (not shown). The analyzing unit 36 reads the image data from the memory and performs necessary processes. Processes in the analyzing unit 36 are as described below.

Process 1

When the temperature distribution of the die 16 reveals that the temperature of any of the high-temperature locations in the die 16 exceeds a threshold value (hereinafter, such a condition will be referred to as "high-temperature abnormality"), the driving power of the pump 26 is enhanced. With this, the processor 18 is prevented from exhibiting malfunction such as thermal runaway and from being permanently damaged while the inventive apparatus is performing heat evaluation. The analyzing unit 36 may identify and record the time of occurrence of high-temperature abnormality from the time of an image frame. Information useful for heat evaluation by a developer becomes available by recording an incidence of high-temperature abnormality with the associated time, in process 2 described below as well as in process 1.

Process 2

When a high-temperature abnormality occurs, the operating condition of the processor 18 is controlled. For example, the operating frequency of the processor 18 is reduced by generating an interrupt or the like. For this purpose, the operating system (OS) that operates the processor 18 for evaluation is configured such that a handler for operating frequency control is called from an interrupt by the analyzing unit 36.

The operation of the apparatus according to the first embodiment will be described below. Prior to heat evaluation, the pump 26 is turned on so that the coolant starts flowing. The infrared camera 24 is also turned on so as to start monitoring the heat generation condition.

The processor 18 starts its operation in accordance with, for example, an instruction from the analyzing unit 36. Capturing of an inspection image by the infrared camera 24 is synchronized with the operation of the processor 18. If a high-temperature abnormality occurs while the processor 18 is running a program for evaluation, the analyzing unit 36 controls the pump 26 or the processor 18 so that either the heat release effect is enhanced or heat generation itself is suppressed.

In this way, not only the processor 18 is operated normally but also it is possible to identify what kind of program causes a high-temperature abnormality, as a result of analysis. It is also possible to estimate what type of countermeasure is effective to correct a high-temperature abnormality. Consequently, it is possible to define a requested thermal measure to be taken by a set manufacturer before the processor 18 is put into the market. Moreover, findings on heat evaluation can be reflected in the architecture design of the processor 18 itself.

For more accurate recording of heat generation condition, it is meaningful to consider temperature gradient occurring due to the flow of the coolant. For example, when the coolant flows from left to right as indicated by arrow a in FIG. 2, the temperature of the die 16 is naturally higher on the left than on the right. If temperature distribution is recorded and evaluated in this state, the result is not necessarily accurate. In order to correct this, the analyzing unit 36 may perform the following processes.

The pump 26 is controlled to drive the coolant to flow in a reverse direction as appropriate. An average of two sets of temperature distribution data recorded by the heat detecting unit 34 prior to and subsequent to the reversal is taken so that the average is recorded as a temperature distribution. By averaging, the data is corrected in considerable measure for temperature gradient. It is desirable that the direction be reversed at regular intervals. However, the interval should be long enough not to cause high-temperature coolant to remain in the vicinity of the die 16.

The process of 1 is performed and average temperature distribution is obtained. Subsequently, a difference between average temperature distribution and temperature distribution occurring when the coolant is caused to flow in a given direction is used as a basis for calculation of temperature gradient occurring when the coolant is caused to flow in the given direction. Thereafter, the coolant is caused to flow only in the given direction. An accurate temperature distribution is obtained by multiplying an acquired temperature distribution by the temperature gradient thus determined.

Second Embodiment

Similarly to the first embodiment, the second embodiment also relates to an apparatus designed to evaluate the heat generation condition of a semiconductor integrated circuit in the development stage. Those aspects of the second embodiment that are common to the first embodiment are omitted in the following description. The heat control system 100 according to the second embodiment is constructed similarly to the system of FIG. 1. The operation of the system 100 according to the second embodiment is also similar to that of the first embodiment. The structure of the hollow glass plate 20, which functions as a cooling mechanism with a hollow part, is different from that of the first embodiment. In the first embodiment, the coolant is caused to flow in the flat, hollow glass plate 20 so as to cool the processor. An image is captured by the infrared camera 24 through the coolant. In contrast, in the second embodiment, it is ensured that the hollow part of the hollow glass plate 20 is not interposed between the die 16, which is subject to observation, and the infrared camera 24.

Figure 3:
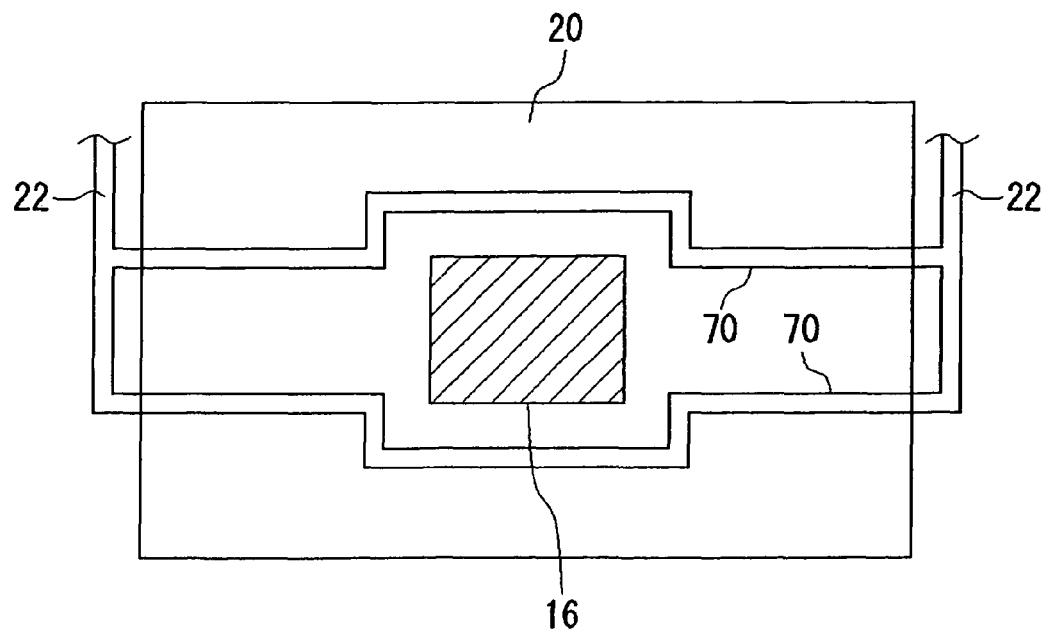
FIG. 3 is a partial top view of a heat control system according to a second embodiment.

FIG. 3 is a top view of the hollow glass plate 20 used in the second embodiment. A coolant passage 70 is provided by boring with a predetermined clearance from the die 16 so as not to interfere with capturing of an image of the die 16 by the infrared camera 24 by being in the way. The predetermined clearance is determined by a thermal conduction simulator so as to simulate the heat release condition similar to a heat sink. The term "with a predetermined clearance" means the fact that the passage 70 is secured not to interfere with capturing an image of the part of the die 16 sought to be measured for temperature distribution. Thus, when an image of only the center of the die 16 is to be captured, what is required is that the passage 70 is clear of the center sought to be shot, in a top view of the hollow glass plate 20. The passage 70 may overlap a portion of the die 16. The coolant passage 70 is connected to the fine passage 22. The coolant is driven by the pump 26 to circulate inside the passage 70.

In the heat control system 100 constructed as described above, the coolant is not located between the processor die 16, which is subject to observation, and the infrared camera 24. Accordingly, the coolant itself may be nontransparent. The flexibility allowed in the choice is extensive. Water is used widely as a coolant due to its ease of handling. While water is not completely transparent in the infrared zone, it can be used in the second embodiment without any problems. Since the coolant does not affect temperature measurement by the infrared camera 24 according to the second embodiment, correction for interposition of the coolant is not necessary. Therefore, the temperature distribution of the die 16 can be measured with a high precision. The temperature distribution as measured purely indicates the temperature distribution of the die 16. Therefore, the data need not be corrected for temperature gradient dependent on the direction of flow of the coolant. The cooling capability of the coolant is higher in the upstream than in the downstream and so it is still meaningful to change the direction of flow of the coolant occasionally for proper control of the heat generation condition.

Third Embodiment

Figure 4:
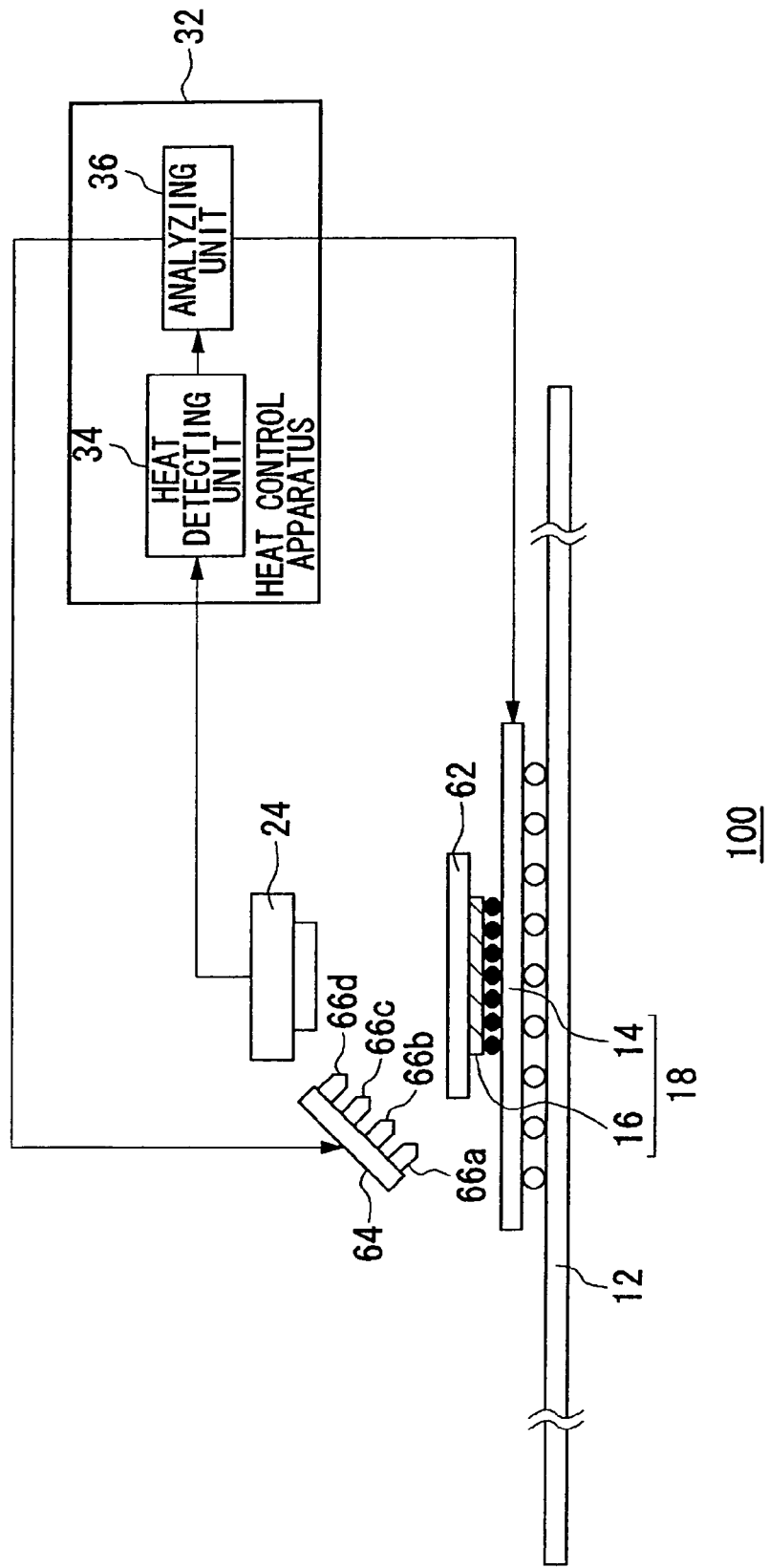
FIG. 4 shows the overall structure of a heat control system according to a third embodiment.

Similarly to the first and second embodiments, the third embodiment also relates to a heat control system. FIG. 4 shows the overall structure of the heat control system 100 according to the third embodiment. In the figure, those components that are similar to the corresponding components in FIG. 1 are designated by identical numerals so that the description thereof is omitted. A difference from the structure of FIG. 1 is that a silicon heat spreader 62 is used as a transparent cooling mechanism, in place of the hollow glass plate 20. Silicon is not transparent to visible light but is transparent to infrared light. Silicon is also relatively high in coefficient of thermal conductivity. Accordingly, efficient thermal cooling is achieved without interfering with the measurement of temperature distribution on the surface of the die 16 by the infrared camera 24. The heat control system 100 according to the third embodiment is also provided with a jet cooling apparatus 64 in place of the pump 26 for circulating a coolant.

The jet cooling apparatus 64 is provided with a plurality of cooling nozzles 66a-66d, generically referred to as cooling nozzles 66. The jet cooling apparatus 64 is known as a cooling method in which a local coefficient of thermal conductivity is high. Cooling is achieved by spraying a heat generating object with a jet of coolant from a cooling nozzle. The spray jet of coolant from the cooling nozzle is spread around a jet axis. The cooling effect is high at and near the center. In the third embodiment, the jet cooling apparatus 64 is provided with a plurality of cooling nozzles 66a-66d arranged to cover the entirety of the die 16. The number of cooling nozzles is determined by the area of the die 16 or by the cooling capability of the individual cooling nozzles determined by the nozzle diameter or the like.

The infrared camera 24 acquires the temperature distribution on the surface of the die 16. The analyzing unit 36 analyzes an inspection image so as to identify a high-temperature location characterized by localized heat generation. The analyzing unit 36 controls the jet cooling apparatus 64 so as to drive harder those of the plurality of cooling nozzles 66 corresponding to the high-temperature location.

The direction of coolant jet from the cooling nozzles 66 may be controllable by an actuator. In this case, data corresponding to the position coordinate of the high-temperature location is fed from the analyzing unit 36 to the jet cooling apparatus 64. Intensive cooling may be achieved by directing the jet from the cooling nozzles 66 towards the high-temperature location by the actuator.

Thus, according to the third embodiment, it is possible to cool the die 16 via a spreader by using the silicon heat spreader 62. The jet cooling apparatus 64 is used to cool the die 16. The infrared camera 24 acquires the temperature distribution on the surface of the die 16. The heat generation condition on the die 16 is equalized by intensively cooling a high-temperature location by the jet cooling apparatus 64.

In the third embodiment, in addition to operating the jet cooling apparatus 64, the processor 18 may be controlled in accordance with the heat generation condition of the die 16, so as to suppress heat generation itself. In this way, temperature distribution is equalized more efficiently.

Instead of the jet cooling apparatus 64, the heat spreader 62 of the third embodiment may be cooled by another means that does not interfere with capturing of an image of the die 16 by the infrared camera 24. For example, the edge of the heat spreader may be brought into contact with a Peltier cooler a water-cooled pipe for cooling. Alternatively, an air-cooling fan may be used.

Since an ordinary processor is formed on a silicon substrate, the substrate and the silicon heat spreader are made of the same material. Therefore, the silicon substrate on which the processor is formed may be designed to have an extension having an area and thickness required of a heat spreader so that the extension may be used as a heat spreader. In other words, a silicon substrate with characteristics such as area and thickness required of a heat spreader may be prepared so that gate-based logic or the like may be implemented thereon. In this case, heat loss at an adhesive interface between the processor and the heat spreader is not incurred so that more efficient cooling is achieved. This approach is suitable also from a viewpoint that highly precise measurement capable of easy correction is achieved, as the infrared camera 24 directly measures the temperature distribution of the die 16.

Fourth Embodiment

The first through third embodiments relate to an apparatus designed for the purpose of evaluation in the development stage. The fourth embodiment relates to an apparatus which is actually mounted on a set and which performs heat control in actual use. The fourth embodiment also employs a cooling mechanism for circulating a coolant. Therefore, it is not necessary to fit a large structure such as a corrugated heat sink to a semiconductor circuit device. Thereby, the flexibility in the mechanism of a set and in designing the set is enhanced.

Figure 5:
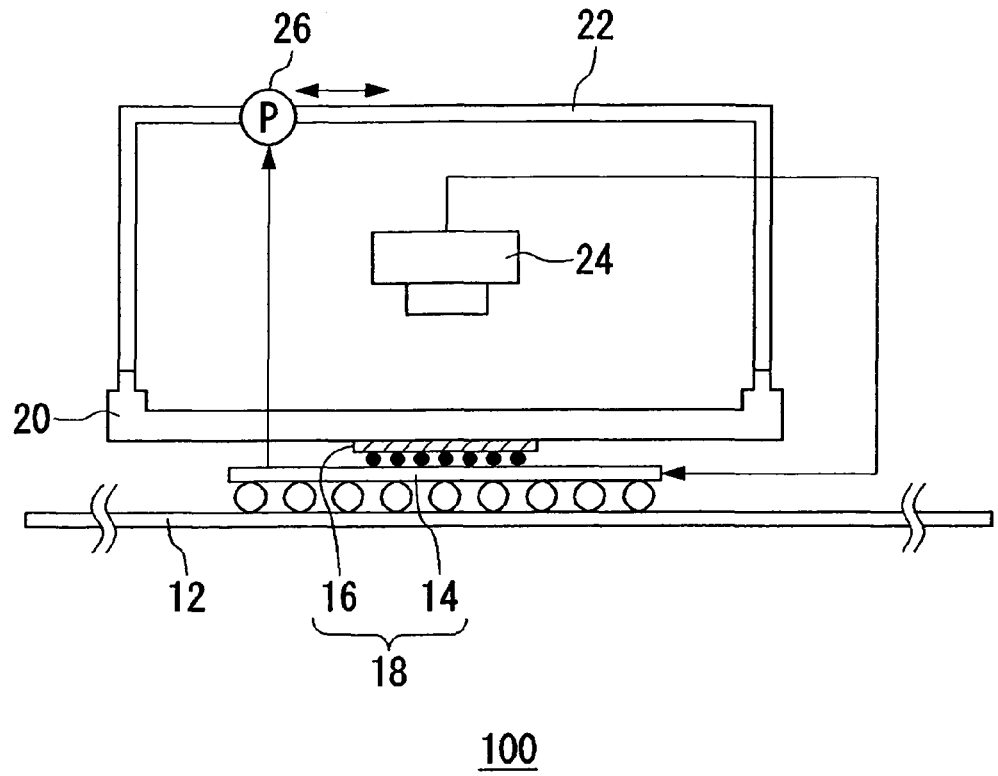
FIG. 5 shows the overall structure of a heat control system according to a fourth embodiment.

FIG. 5 shows the overall structure of the heat control system 100 according to the fourth embodiment. In the figure, those components that are similar to the corresponding components in FIG. 1 are designated by identical numerals so that the description thereof is omitted. A difference from the structure of FIG. 1 is that an output from the infrared camera 24 is directly fed to the processor 18 and that the processor 18 controls the pump 26. Simply stated, the findings obtained by the heat control apparatus 32 of the first embodiment are directly installed in the processor 18. The cooling mechanism according to the fourth embodiment comprising the hollow glass plate 20 and the pump 26 may be any of the alternative cooling mechanisms described in the second and third embodiments.

Figure 6:
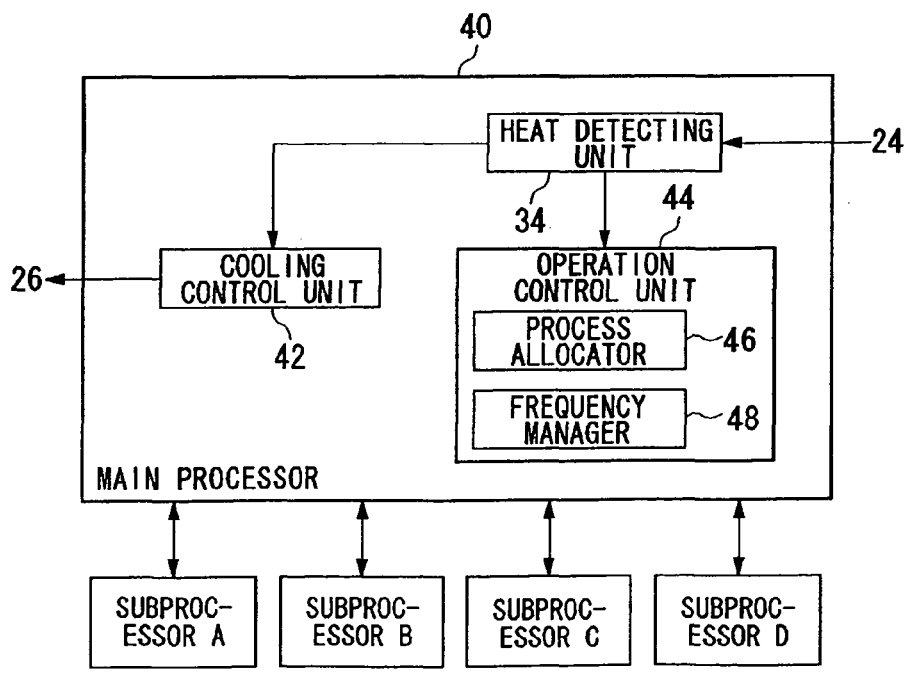
FIG. 6 shows the internal structure of a processor of FIG. 5.

FIG. 6 shows the internal structure of the processor 18. The processor 18 is provided with a main processor 40 and four subprocessors A-D of the same structure. The main processor 40 is provided with a heat detecting unit 34, a cooling control unit 42 and an operation control unit 44. The main processor 40 is also responsible for other general-purpose processes that are not illustrated. An image of the temperature distribution on the surface of the die 16 captured by the infrared camera 24 is fed to the heat detecting unit 34 so as to identify a high-temperature location on the die 16 in which a high-temperature abnormality occurs. If it is determined that a high-temperature abnormality occurs as a result of monitoring by the heat detecting unit 34, one or both of the cooling control unit 42 and the operation control unit 44 are activated to improve the heat release efficiency and/or suppress heat generation. The cooling control unit 42 enhances the driving power of the pump 26 in the event of a high-temperature abnormality. The operation control unit 44 is provided with a process allocator 46 and a frequency manager 48 and lowers the temperature of the high-temperature location.

If a high-temperature abnormality is found in any of the subprocessors A-D, the process allocator 46 reallocates a process to be delivered to the associated subprocessor to another subprocessor. Normally, processes amenable to parallel processing are sequentially delivered to available subprocessors according to a least recently used algorithm or another approach. If, however, a high-temperature abnormality occurs, the process allocator 46 can avoid delivery of a new process, by setting a flag of a subprocessor including a high-temperature location to indicate that the subprocessor is permanently "in use". When the high-temperature abnormality is corrected, the flag is cleared.

The frequency manager 48 reduces the operating frequency when a high-temperature abnormality occurs. If the operating frequency is common to the main processor 40 and the subprocessors A-D, the overall operating frequency may be lowered uniformly. If the architecture is such that the operating frequency is variable block by block in the main processor 40 and the subprocessors A-D, it serves the purpose to reduce the operating frequency of the block that includes the high-temperature location.

Selection from the process allocator 46, the frequency manager 48 and the cooling control unit 42, and the extent to which the selected function(s) is exploited may be determined by experiments. In that process, any of the apparatuses according to the first through third embodiments may be used. As described, the fourth embodiment is configured such that, when the heat detecting unit 34 detects a high-temperature abnormality, the process allocator 46 and the frequency manager 48 control the load imposed on and the processing speed of those of the subprocessors A-D in which a high-temperature abnormality occurs, thereby controlling heat generation from the high-temperature location and equalizing the temperature distribution on the surface of the die 16.

Fifth Embodiment

The fifth embodiment relates to an apparatus in which the heat release effect by the hollow glass plate 20 is enhanced. The fifth embodiment may be used in combination with the first embodiment and/or the second embodiment but its application is not limited to this. The fifth embodiment can be widely used as a heat control apparatus. If the infrared camera 24 is not used in the fifth embodiment, the hollow glass plate 20 need not be transparent and may be formed of a material or the like superior in thermal conductivity such as aluminum and copper.

Figure 7A:
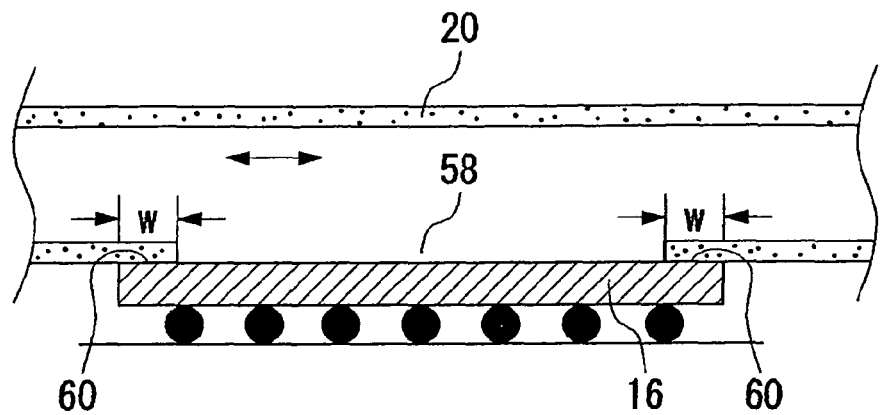
FIGS. 7A and 7B show a part of a heat control system according to a fifth embodiment.
Figure 7B:
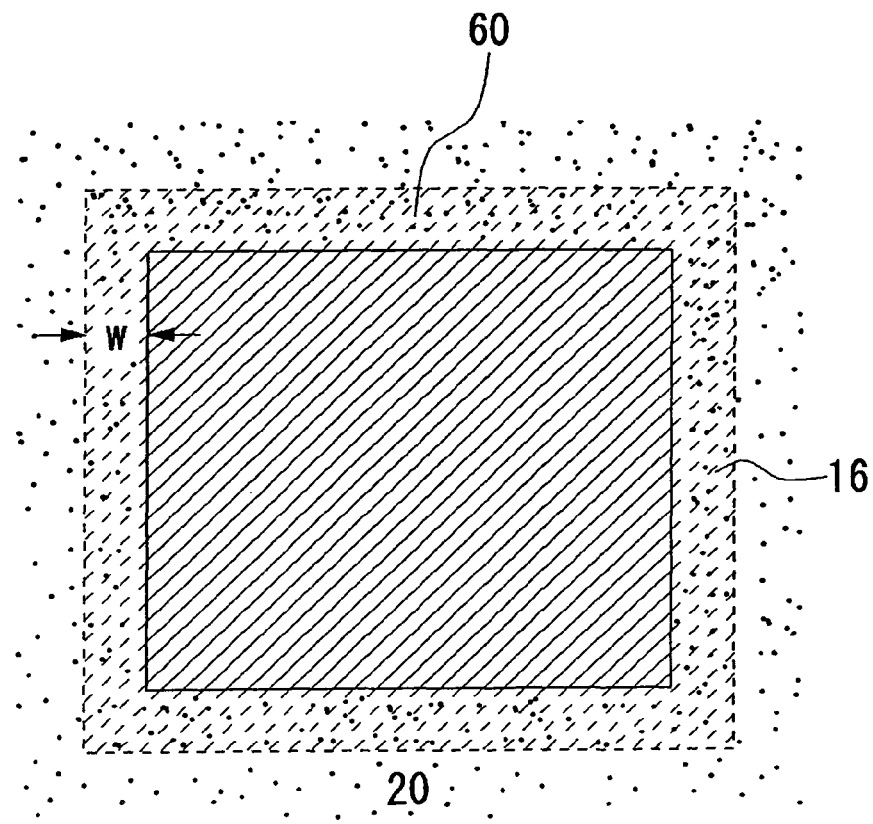

FIG. 7A is an enlarged view of the neighborhood of the die 16 according to the fifth embodiment; and FIG. 7B is a top view thereof. The hollow glass plate 20 is drawn with a stipple pattern and the die 16 is indicated by oblique lines. The hollow glass plate 20 is provided with an opening 58 opposite to the exposed surface of the die 16. The hollow glass plate 20 is tightly and adhesively attached to the peripheral portion of the die 16 by anodic bonding or the like, creating an overlapping portion of a width W. The term "tightly and adhesively attached" means fixing the plate such that the coolant does not leak outside from the hollow portion. This structure ensures that the coolant comes into direct contact with the backside of the die 16 and is highly effective in releasing heat.

Figure 8:
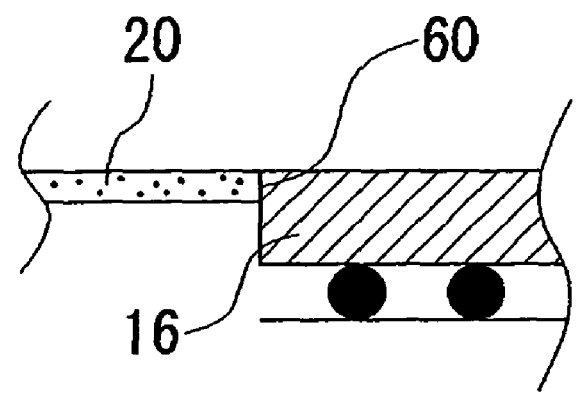
FIG. 8 shows the structure of a variation of the fifth embodiment.

FIG. 8 shows a variation of the fifth embodiment and shows a part where the die 16 is joined with the hollow glass plate 20. As illustrated, the opening of the hollow glass plate 20 is formed by boring so as to fit the outline of the die 16. The interior surface of the hollow glass plate 20 and the upper surface of the die 16 are flush with each other. In this structure, the flow of the coolant is smoother than otherwise so that an even higher heat release effect is expected.

Described above is an explanation based on the embodiments. The embodiments are only illustrative in nature and it will be obvious to those skilled in the art that variations in constituting elements and processes are possible within the scope of the present invention. The following are examples of such variations.

In the embodiments, the infrared camera 24 is used. Alternatively, other image capturing sensors may be used. For example, an image capturing unit of a digital camera using an ordinary charge-coupled device (CCD) may serve the required function. In this case, an infrared film provided in the image capturing unit may be removed. This structure is favorable both in terms of unit price and size.

In the embodiments, examples were given where the backside of the die 16 is exposed. The backside may not necessarily be exposed. A heat spreader may be mounted on the backside of the die 16.

In the embodiments, no discussion was given of a means for cooling a coolant. Such means may of course be provided. The cooling means may be such that the surface area of the fine passage 22 is enlarged so that heat is released by a fan or the like. The analyzing unit 36 of FIG. 1 and the cooling control unit 42 of FIG. 4 may control the cooling means.

In reducing the operating frequency of the processor 18, stepwise control may be exercised in accordance with the heat generation condition. For example, a plurality of threshold values for determination of a high-temperature abnormality may be provided so that the operating frequency is reduced gradually. A similar approach may be employed to control the driving power of the pump 26.

While the preferred embodiments of the present invention have been described using specific terms, such description is for illustrative purposes only, and it is to be understood that changes and variations may be made without departing from the spirit or scope of the appended claims.

What is claimed is:

1. A heat control apparatus for a circuit, comprising:
   a transparent cooling mechanism tightly secured to a semiconductor integrated circuit, the transparent cooling mechanism having a hollow part;
   an image capturing sensor which captures an image of the semiconductor integrated circuit through the cooling mechanism;
   a heat detecting unit which acquires the heat generation condition of the semiconductor integrated circuit from an inspection image captured by the sensor;
   an analyzing unit which analyzes the acquired heat generation condition; and
   a driving mechanism for causing a coolant to flow in the hollow part of the transparent cooling mechanism, wherein the hollow part is provided so as not to overlap at least a portion of the semiconductor integrated circuit subject to observation by the image capturing sensor.

2. The heat control apparatus for a circuit according to claim 1, wherein the cooling mechanism is a silicon heat spreader and comprises a cooling means for cooling the heat spreader.

3. The heat control apparatus for a circuit according to claim 1, wherein the driving mechanism changes the direction of flow of the coolant as appropriate.

4. The heat control apparatus for a circuit according to claim 3, wherein the analyzing unit synthetically analyzes heat generation conditions detected prior to and subsequent to a change in the direction of flow of the coolant.

5. The heat control apparatus for a circuit according to claim 1, wherein the analyzing unit analyzes the heat generation condition by taking into account temperature gradient dependent on the direction of flow of the coolant.

6. The heat control apparatus for a circuit according to claim 1, wherein the heat detecting unit acquires the temperature distribution of the semiconductor integrated circuit from the inspection image, and if the temperature exceeds a predetermined threshold value at any location in the semiconductor integrated circuit, the cooling control unit enhances the cooling capability of the cooling means.

7. The heat control apparatus for a circuit according to claim 1, further comprising:
   an operation control unit for controlling the operating condition of the semiconductor integrated circuit in accordance with the acquired heat generation condition.

8. The heat control apparatus for a circuit according to claim 7, wherein the heat detecting unit acquires the temperature distribution of the semiconductor integrated circuit from the inspection image, and if the temperature exceeds a predetermined threshold value at any location in the semiconductor integrated circuit, the operation control unit reduces a load per unit time in the location where the temperature exceeds the threshold value.

* * * * *